United States Patent
Ohuchi et al.

(10) Patent No.: US 11,830,915 B2
(45) Date of Patent: Nov. 28, 2023

(54) NITRIDE SEMICONDUCTOR DEVICE (71) Applicant: FUJI ELECTRIC CO., LTD., Kawasaki (JP)

(72) Inventors: Yuki Ohuchi, Suginami (JP); Katsunori Ueno, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 160 days.

(21) Appl. No.: 17/186,274

(22) Filed: Feb. 26, 2021

(65) Prior Publication Data

US 2021/0288148 A1   Sep. 16, 2021

(30) Foreign Application Priority Data

Mar. 16, 2020   (JP) .................... 2020-45613

(51) Int. Cl.
  *H01L 29/20* (2006.01)
  *H01L 29/04* (2006.01)
  *H01L 29/78* (2006.01)
  *H01L 29/51* (2006.01)
  *H01L 29/10* (2006.01)

(52) U.S. Cl.
  CPC ........ *H01L 29/2003* (2013.01); *H01L 29/045* (2013.01); *H01L 29/1033* (2013.01); *H01L 29/517* (2013.01); *H01L 29/518* (2013.01); *H01L 29/7802* (2013.01)

(58) Field of Classification Search
  CPC ............... H01L 29/2003; H01L 29/045; H01L 21/28264
  See application file for complete search history.

(56) References Cited

U.S. PATENT DOCUMENTS

2012/0146134 A1   6/2012   Kamada
2013/0069175 A1   3/2013   Ozaki et al.
(Continued)

FOREIGN PATENT DOCUMENTS

JP   2008205029 A   9/2008
JP   201294877 A   5/2012
(Continued)

OTHER PUBLICATIONS

Cai et al., High-Performance Enhancement-Mode AlGaN/GaN HEMTs Using Fluoride-Based Plasma Treatment; IEEE Electron Device Letters, vol. 26, No. 7, Jul. 2005, pp. 435-437.
(Continued)

*Primary Examiner* — Chad M Dicke
*Assistant Examiner* — Valerie N Newton (57) ABSTRACT

A nitride semiconductor device includes a GaN-based semiconductor layer; and an insulating film provided on a first surface of the GaN-based semiconductor layer, the insulating film containing O atoms, and other constituent atoms other than O. An interface between the GaN-based semiconductor layer and the insulating film has a terminating species which terminates a dangling bond of a Ga atom, the terminating species has an outermost electron shell in which one electron is deficient from an allowed number of outermost electrons, and is an atom or molecule having stronger bond to the Ga atom than a H atom, an amount of Ga—O bonds is greater than an amount of bonds between the Ga atoms and the other constituent atoms.

9 Claims, 6 Drawing Sheets (56) References Cited

U.S. PATENT DOCUMENTS

2017/0040159 A1* 2/2017 Kachian ............ H01L 21/02205
2019/0157448 A1   5/2019 Takashima et al.
2019/0280112 A1* 9/2019 Shimizu ................ H01L 29/205

FOREIGN PATENT DOCUMENTS

| JP | 2012124438 A | 6/2012 |
| JP | 201365613 A  | 4/2013 |
| JP | 201996744 A  | 6/2019 |

OTHER PUBLICATIONS

Yayama et al., "Defect Control with fluorine for GaN-MIS type electronic devices", National Institute of Materials Science, 2016, 1 page.

* cited by examiner

NITRIDE SEMICONDUCTOR DEVICE

CROSS REFERENCE TO RELATED APPLICATIONS

This application is based upon and claims the benefit of priority from the prior Japanese Patent Application No. P2020-045613 filed on Mar. 16, 2020, the entire contents of which are incorporated herein by reference.

BACKGROUND OF THE INVENTION

1. Field of the Invention

The present invention relates to a nitride semiconductor device.

2. Description of the Related Art

A nitride semiconductor device having a Metal Oxide Semiconductor (MOS) structure is known (see, for example, JP 2019-96744A).

Further, it is known that the dangling bonds near the surface of the nitride semiconductor layer are terminated with hydrogen to reduce the inter-electrode leakage that occurs near the surface (see, for example, JP 2008-205029A).

When a silicon oxide ($SiO_2$) film is deposited on a gallium nitride (GaN) layer as a gate insulating film, the $SiO_2$ film is deposited by a chemical vapor deposition (CVD) method instead of thermal oxidation. The insulating film, such as the $SiO_2$ film, formed by the CVD method has low density, and it is necessary to anneal the $SiO_2$ film after the deposition at a high temperature in order to increase the breakdown voltage. When gallium (Ga) atoms near the interface between the GaN layer and the $SiO_2$ film are terminated by hydrogen (H) atoms, the H atoms may be desorbed from the Ga atoms due to heating so as to yield dangling bonds on the Ga atoms.

When the dangling bonds of the Ga atoms is yielded near the interface between the GaN layer and the $SiO_2$ film, spatially localized interface-states may be generated in the bandgap to be origins of carrier traps. Thus, it is possible to reduce the electrical properties of the nitride semiconductor device due to reduction in carrier mobility.

SUMMARY OF THE INVENTION

An aspect of the present invention inheres in a nitride semiconductor device, including: (a) a gallium nitride-based semiconductor layer; and (b) an insulating film provided on a first surface of the gallium nitride-based semiconductor layer, the insulating film containing oxygen atoms, and other constituent atoms other than oxygen, wherein an interface between the gallium nitride-based semiconductor layer and the insulating film has a terminating species which terminates a dangling bond of a gallium atom, the terminating species has an outermost electron shell in which one electron is deficient from an allowed number of outermost electrons, and is an atom or molecule having stronger bond to the gallium atom than a hydrogen atom, an amount of bonds between the gallium atoms and the oxygen atoms is greater than an amount of bonds between the Ga atoms and the other constituent atoms.

DETAILED DESCRIPTION

The present inventors have found that when a dangling bond in the $GaN/SiO_2$ interface is terminated by an atom, such as fluoride (F) and chloride (Cl), or a molecule, such as hydroxyl (OH) group and cyano (CN) group, in which one electron is missing in the closed shell, the terminating atoms or molecules have the stronger bond with Ga atoms as compared with the case where the dangling bonds are terminated by hydrogen (H) atoms. Further, regarding the interfacial bond of $GaN/SiO_2$, we have found that interface-states in the bandgap, which may be referred to as bandgap-states, may be not generated when the interfacial bonds are gallium (Ga)-oxygen (O) bonds, and the bandgap-states may be generated near the upper end of the valence band when the interfacial bonds are Ga—Si bonds. We also have found that by using the Ga—O bond as the main interfacial bond, the generation of the bandgap-states can be prevented and high conduction can be available. The present invention has been made based on such findings.

Exemplary embodiments of the present invention will be described below with reference to the drawings. In the following descriptions of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other.

Figure 1:
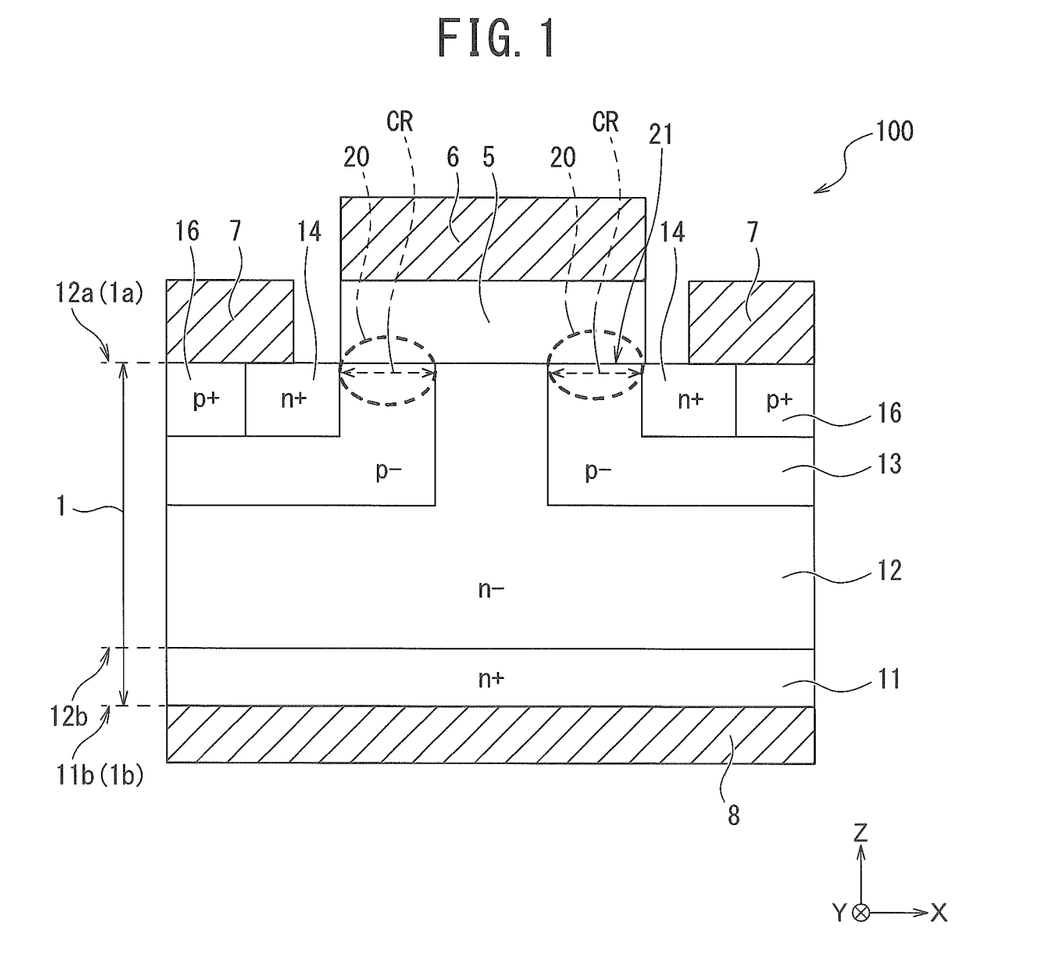
FIG. 1 is a cross-sectional view illustrating an example of a MOS transistor according to an embodiment of the present invention.

Further, in the following explanations, the direction may be explained by using the wording in an X-axis direction, a Y-axis direction, and a Z-axis direction. For example, as illustrated in FIG. 1, the X-axis direction or the Y-axis direction is a direction parallel to a surface 12a of a GaN layer 12. The X-axis direction, the Y-axis direction, or both the X-axis direction and the Y-axis direction may be referred to as the horizontal direction. The Z-axis direction is the normal direction of the surface 12a. The Z-axis direction is also the thickness direction of the GaN layer 12. The X-axis direction, the Y-axis direction and the Z-axis direction are orthogonal to each other.

Further, in the following descriptions, the direction of the arrow on the Z-axis may be referred to as "top", and the direction opposite to the arrow on the Z-axis may be referred to as "bottom". The "top" and "bottom" do not necessarily mean vertical to the ground. That is, the "top" and "bottom" directions are not limited to the direction of gravity. The "top" and "bottom" are merely convenient expressions for specifying relative positional relationships in regions, layers, films, substrates, etc., and do not limit the technical idea of the present invention. For example, when the paper surface is rotated 180 degrees, the "top" is changed to the "bottom", and the "bottom" is changed to the "top".

Further, in the following descriptions, "n" or "p" denotes that electrons or holes are major carriers, respectively. In addition, the superscript "+" or "−" added to the mark "n" or "p" denotes that a semiconductor region has relatively high or low impurity concentration than a region without the superscript "+" or "−" added. It should be noted that semiconductor regions denoted by the same mark, such as "p", do not necessarily have exactly the same impurity concentration.

<Configuration>

FIG. 1 is a cross-sectional view illustrating a configuration of a metal-oxide-semiconductor (MOS) transistor 100 as a nitride semiconductor device according to an embodiment of the present invention. The nitride semiconductor device according to the embodiment of the present invention is, for example, a power semiconductor device, which is an n-type MOS transistor 100 provided on a gallium nitride (GaN)-based epitaxial substrate 1 illustrated in FIG. 1. FIG. 1 illustrates a unit structure of the MOS transistor 100. The unit structure extends in the Y-axis direction and a plurality of the unit structures are repeatedly disposed in the X-axis direction. A region provided with the unit structures is referred to as an active region. Although not illustrated, an edge termination structure for preventing electric field concentration in the active region is provided around the active region. The edge termination structure may include one or more of a guard ring structure, a field plate structure and a junction termination extension (JTE) structure.

As illustrated in FIG. 1, the MOS transistor 100 having a planar insulated-gate structure includes a gate insulating film 5, or an "insulating film" 5, provided on the GaN-based epitaxial substrate 1 and a gate electrode 6 provided on the gate insulating film 5, a source electrode 7 provided on an upper portion of the GaN-based epitaxial substrate 1 and a drain electrode 8 provided on a bottom surface 1b of the GaN based epitaxial substrate 1. The GaN-based epitaxial substrate 1 includes, for example, a GaN substrate 11 and a GaN layer 12 epitaxially grown on the GaN substrate 11. The GaN layer 12 may be referred to as a "GaN based semiconductor layer". As illustrated in FIG. 1, an upper surface 12a, or a first surface 12a, of the GaN layer 12 corresponds also to a top surface 1a of the GaN-based epitaxial substrate 1. A lower face 12b, or a second surface 12b, located on an opposite side of the upper surface 12a of the GaN layer 12 is in contact with the GaN substrate 11. A lower face 11b of the GaN substrate 11 corresponds also to the bottom surface 1b of the GaN-based epitaxial substrate 1.

The GaN substrate 11 may be a GaN single crystal substrate. The GaN substrate 11 has, for example, an $n^+$-type conductivity. The GaN substrate 11 is doped with n-type dopants, which are n-type impurities, selected from at least one of elements, such as silicon (Si), oxygen (O), germanium (Ge) and the like. For example, the impurity element may be O. An impurity concentration of O in the GaN substrate 11 may be about $2\times10^{18}$ per cubic-centimeter or more. The GaN substrate 11 may be a low-dislocation-density free-standing substrate having a dislocation density of less than about $1\times10^7$ per square-centimeter. By using the low-dislocation-density free-standing substrate for the GaN substrate 11, the GaN layer 12 grown on the GaN substrate 11 may also have a low dislocation density. Further, by using the low-dislocation-density free-standing substrate for the GaN substrate 11, even when a power device having a large area is formed on the GaN substrate 11, a leakage current in the power device can be reduced. As a result, the power device may be manufactured by a manufacturing apparatus at a high yield rate. Further, in the heat treatment, it is possible to prevent ion-implanted impurities from deeply diffusing through the dislocations.

The GaN layer 12 is provided on the GaN substrate 11. The GaN layer 12 is an $n^-$-type GaN single crystal layer grown on the GaN substrate 11 by an epitaxial growth method. The GaN layer 12 is doped with the n-type dopants, which are the n-type impurities, selected from at least one of elements, such as silicon (Si), oxygen (O), germanium (Ge) and the like. For example, the impurity element may be O. A p-type well region 13, an $n^+$-type source region 14 and a $p^+$-type contact region 16 are provided on the upper surface 12a side of the GaN layer 12. In the GaN layer 12, a region in which the well region 13, the source region 14 and the contact region 16 are not provided may be referred to as a drift region. The drift region may be served as a current path between the GaN substrate 11 and the well region 13.

The well region 13 is formed by implanting p-type dopant ions from the upper surface 12a side of the GaN layer 12 and activating the implanted p-type dopant ions. For the p-type dopant, for example, Mg (magnesium) may be used. The well region 13 may be provided to be in contact with the upper surface 12a of the GaN layer 12. Further, as illustrated in FIG. 1, the well region 13 has a first side in contact with the source region 14 and a second side in contact with the drift region directly below the gate insulating film 5 in a lateral direction, or the X-axis direction. In the well region 13, a channel of the MOS transistor 100 is formed between the first side and the second side and adjacent to an interface in contact with the gate insulating film 5. Hereinafter, as illustrated in FIG. 1, a region in which the channel is formed in the well region 13 is referred to as a channel region CR that is a "conductive region".

For example, the channel region CR is located within about 20 nanometers from the upper surface 12a in contact with the gate insulating film 5 to the lower face 12b. A concentration of the p-type dopants, for example, Mg atoms in the channel region CR may be higher than that of the n-type dopants doped in the channel region CR. The concentration of the p-type dopants may be about $1 \times 10^{16}$ per cubic-centimeter or more. The source region 14 is formed by implanting n-type dopant ions from the upper surface 12a side of the GaN layer 12 and activating the implanted dopant ions by annealing. For the n-type dopant, for example, at least one element selected from Si, O, and Ge. The source region 14 may be provided to be in contact with the upper surface 12a of the GaN layer 12 and buried in the well region 13. A side and bottom of the source region 14 are in contact with the well region 13. That is, the source region 14 and the well region 13 are in contact with each other in the X-axis direction, the Y-axis direction, and the Z-axis direction.

The $p^+$-type contact region 16 is formed by implanting p-type dopant ions from the upper surface 12a side of the GaN layer 12 and activating the p-type dopant ions by annealing. For the p-type dopant, for example, Mg may be used. The contact region 16 may be provided to be in contact with the upper surface 12a of the GaN layer 12 and buried in the well region 13. At least a bottom of the contact region 16 is in contact with the well region 13. That is, the contact region 16 and the well region 13 are in contact with each other in the Z-axis direction.

The gate insulating film 5 is provided on the well region 13. The gate insulating film 5 is, for example, a silicon oxide ($SiO_2$) film having an amorphous structure. The gate insulating film 5 has a thickness of about 50 nanometers or more and about 100 nanometers or less. The gate electrode 6 is provided on the gate insulating film 5. The gate electrode 6 is a planar electrode provided on the flat gate insulating film 5. For the gate electrode 6, for example, an impurity-doped polysilicon may be used. The source electrode 7 is continuously provided from the $n^+$-type source region 14 to the $p^+$-type contact region 16 and electrically connected to the source region 14 and the contact region 16, respectively. Although not illustrated, the source electrode 7 may be provided so as to cover the gate electrode 6 via an interlayer insulating film. For the source electrode 7, for example, aluminum (Al) or aluminum-silicon (Al—Si) alloy may be used.

The drain electrode 8 is provided on the lower face 11b of the GaN substrate 11 to be electrically connected to the GaN substrate 11. For the drain electrode 8, for example, Al or Al—Si alloy may be used. For a crystal plane of the upper surface 12a of the GaN layer 12, (0001) plane, (1-100) plane, (11-20) plane, (1-102) plane, or a plane equivalent to any one of these planes may be used. For example, the (1-100) plane is equivalent to (10-10) plane, (01-10) plane, (0-110) plane, (-1100) plane, and the (-1010) plane. As a result, the upper surface 12a of the GaN layer 12 is a plane in which more gallium (Ga) atoms appear on an outermost layer than nitrogen (N) atoms. For example, when the upper surface 12a of the GaN layer 12 is the (0001) plane, that is, the c-plane, the atoms appearing on the outermost surface layer are almost 100% Ga atoms.

Figure 2:
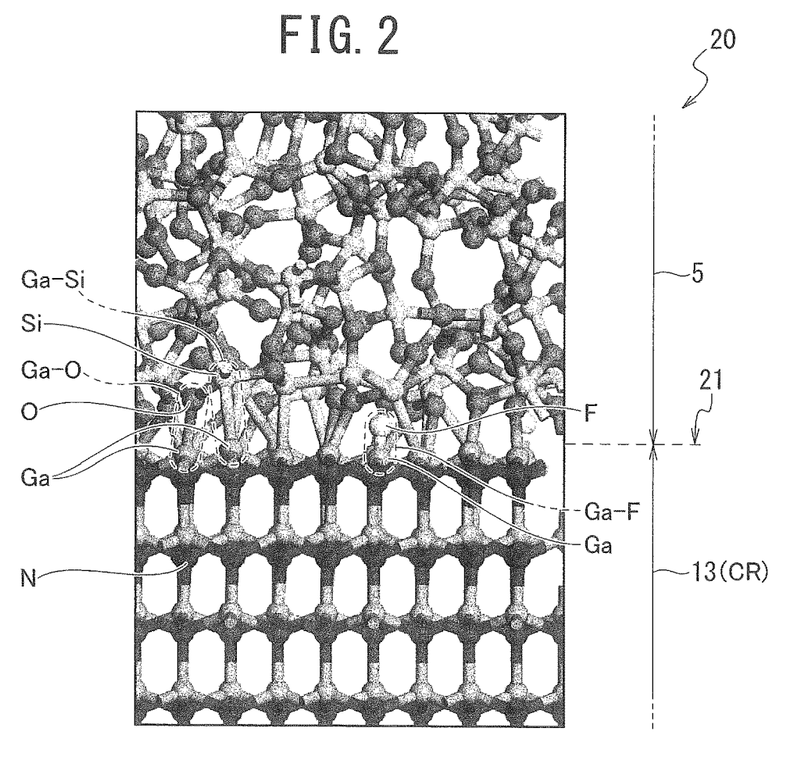
FIG. 2 is a model diagram illustrating an example of inter-atomic bonds adjacent to an interface where a well region and a gate insulating film are in contact with each other.
Figure 3:
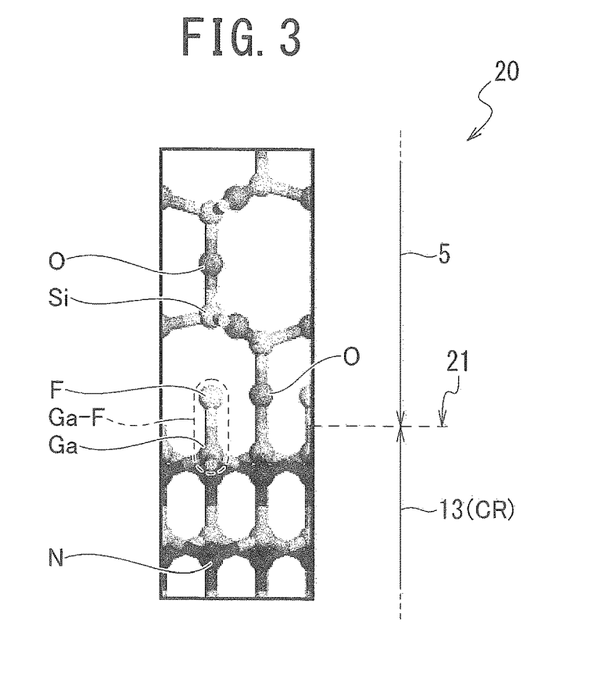
FIG. 3 is an enlarged model diagram illustrating the inter-atomic bonds adjacent to the interface.

FIG. 2 is a model diagram illustrating inter-atomic bonds in a cross-sectional portion 20 adjacent to an interface 21 where the well region 13 and the gate insulating film 5 are in contact with each other. FIG. 3 is an enlarged model diagram illustrating the inter-atomic bonds adjacent to the interface 21. In FIGS. 2 and 3, the upper surface 12a of the GaN layer 12 illustrated in FIG. 1 is the (0001) plane, and the Ga atoms are arranged on a top surface of an outermost surface layer of the well region 13 buried in the GaN layer 12. Most of the Ga atoms are bonded to the O atoms of the $SiO_2$ film that is the gate insulating film 5.

In the MOS transistor 100, an amount of bonds between the Ga atoms and the O atoms at the interface 21 is greater than an amount of bonds between the Ga atoms and the Si atoms. Since the gate insulating film 5 is composed of the $SiO_2$ film having the amorphous structure, a number of the O atoms in one molecule is more than a number of the Si atoms in one molecule. Further, in the interface 21, some Ga atoms are bonded to, for example, fluorine (F) atoms, which are "terminating elements". Dangling bonds of the Ga atoms are terminated by the F atoms. For example, a first range is defined as a range within 10 nanometers from the interface 21 toward the well region 13 and a second range is defined as a range within 10 nanometers from the interface 21 toward the gate insulating film 5. At least one of the first range and the second range has a region in which the F atoms may be provided of about $1 \times 10^{11}$ per square-centimeter or more. The dangling bonds of the Ga atoms are terminated with the F atoms in the first region or the second region.

Figure 4:
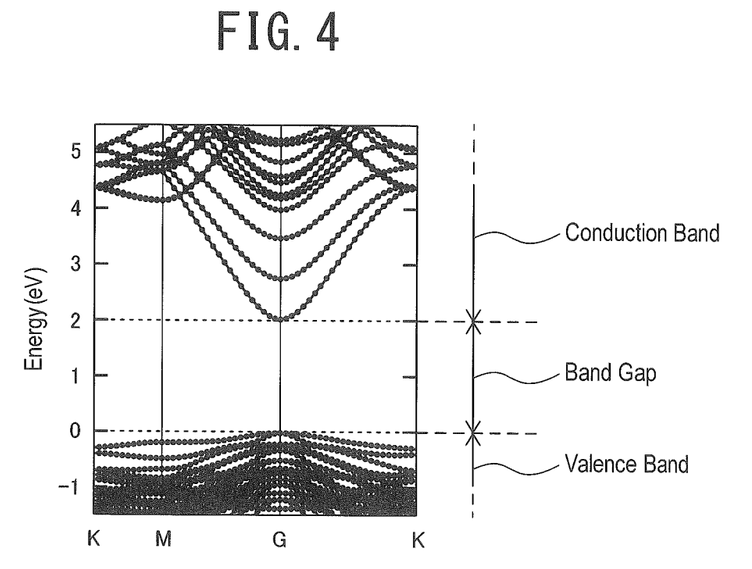
FIG. 4 is a diagram illustrating a bandgap at the interface.

FIG. 4 is a diagram illustrating a bandgap at the interface 21. The vertical axis of FIG. 4 indicates energy (eV), and the horizontal axis of FIG. 4 indicates wave number where characters in the horizontal axis denote points of symmetry in wavenumber space. As illustrated in FIGS. 2 and 3, in the interface 21 where the well region 13 and the gate insulating film 5 are in contact with each other, the dangling bonds of the Ga atoms are terminated by the F atoms. As a result, as illustrated in FIG. 4, it is possible to prevent generation of bandgap-states due to the dangling bonds between the valence band and the conduction band, that is, in the gap.

As illustrated in Table 1, the Ga—F bond has a larger binding energy than the Ga—H bond, and the Ga—F bond is stronger than the Ga—H bond. In Table 1, the binding energies for various terminating-species at the Ga—O bonding interface are listed, and the larger the negative value, the larger the binding energy. Since the Ga—F bond is stronger and more stable than the Ga—H bond, the F atom may not be easily desorbed from the Ga atom even when annealed after the gate insulating film 5 has been formed. As a result, it is possible to prevent the generation of the bandgap-states due to the dangling bonds at the interface 21 even after annealing.

TABLE 1

| | Binding energy at Ga—O bonding interface |
|---|---|
| H | −5.0 eV |
| F | −9.4 eV |
| Cl | −5.2 eV |
| OH | −7.4 |
| CN | −6.1 |

Further, as described above, in the interface 21, the amount of Ga—O bonds is larger than the amount of Ga—Si bonds. Although not illustrated, the bandgap-states may be generated near the valence band in the Ga—Si bonding interface. When the bandgap-states are localized near the valence band, carriers may be trapped in the bandgap-states, resulting in a decrease in a carrier concentration or a decrease in a carrier mobility. On the other hand, in the Ga—O bonding interface, the bandgap-states are not generated. In the MOS transistor 100, although the channel region is formed near the interface 21, it is possible to prevent the generation of the bandgap-states near the interface 21, and to prevent the decrease in the carrier mobility, or electron mobility, in the channel region.

In the embodiment of the present invention, in the interface 21, the amount of the Ga—O bonds is preferably 10 times or more the amount of bonds between the Ga atoms and the other constituent atoms of the gate insulating film 5 other than the O atoms, for example, the Si atoms. Accordingly, it is possible to prevent the generation of the bandgap-state near the interface 21.

<Manufacturing Method>

Figure 5:
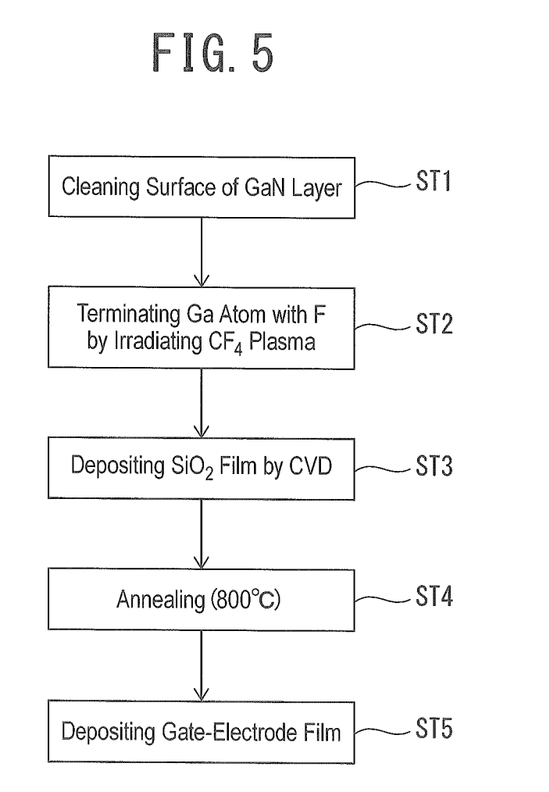
FIG. 5 is a flowchart illustrating an example of a process for forming a planar insulated-gate structure, which includes a termination step of a dangling bond of a Ga atom with an F atom, in a manufacturing method of the MOS transistor according to the embodiment of the present invention.
Figure 6A:
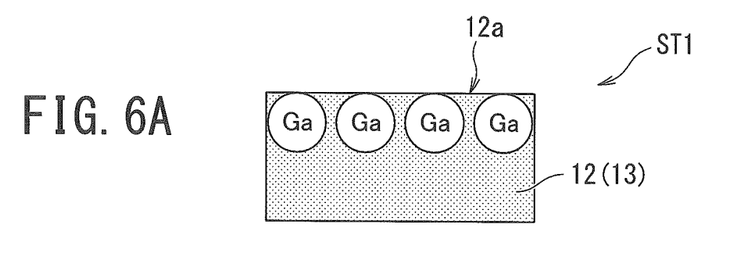
FIG. 6A is a diagram schematically illustrating the cleaning step, denoted by ST1, of the GaN layer.
Figure 6B:
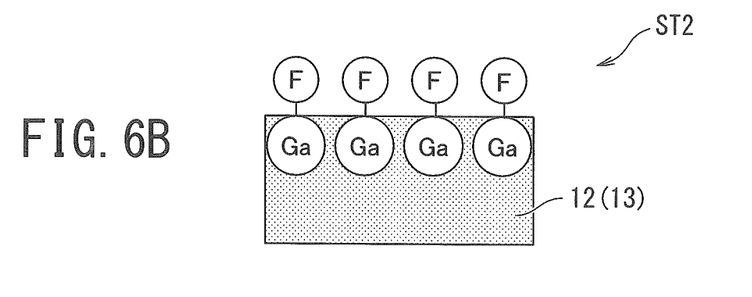
FIG. 6B is a diagram schematically illustrating the termination step, denoted by ST2, of the dangling bonds.
Figure 6C:
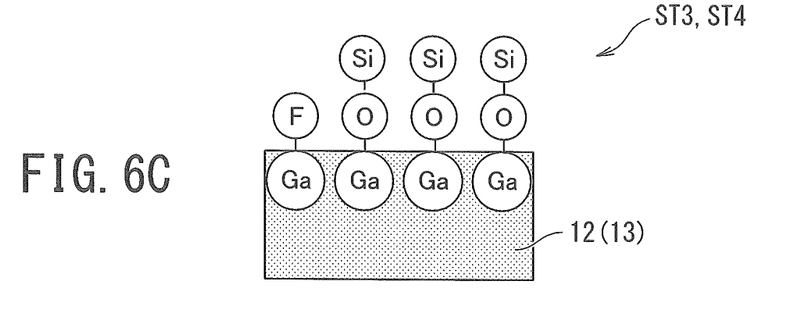
FIG. 6C is a diagram schematically illustrating the deposition step, denoted by ST3, of the gate insulating film and the anneal step, denoted by ST4.

A manufacturing method of the MOS transistor 100 will be described below. FIG. 5 is a flowchart illustrating a process for forming a planar insulated-gate structure in the manufacturing method of the MOS transistor 100 according to an embodiment of the present invention, which includes a step for terminating the dangling bonds of the Ga atoms with the fluorine (F) atoms. FIG. 6A is a diagram schematically illustrating cleaning step, denoted by ST1, of the GaN layer 12. FIG. 6B is a diagram schematically illustrating termination step, denoted by ST2, of the dangling-bonds. FIG. 6C is a diagram schematically illustrating deposition step, denoted by ST3, of the gate insulating film 5, and anneal step, denoted by ST4. In addition, the MOS transistor 100 is manufactured by various apparatuses, such as a cleaning apparatus, a plasma processing system, a deposition apparatus, an annealing furnace, a photolithography system, an etching apparatus and the like. Hereinafter, each of the various apparatuses may be collectively referred to as a manufacturing apparatus.

First, the p-type well region 13 illustrated in FIG. 1 is formed in the GaN layer 12. In step ST1 in FIG. 5, the upper surface 12a of the GaN layer 12 is cleaned by the cleaning apparatus. A cleaning method may be wet cleaning or dry cleaning. In the wet cleaning, the GaN-based epitaxial substrate 1 having the GaN layer 12 is immersed in a chemical solution. Alternatively, the chemical solution may be sprayed on the upper surface 12a of the GaN layer 12 to remove organic substances and the like from the upper surface 12a of the GaN layer 12. In the dry cleaning, the organic substances and the like are removed by exposing the upper surface 12a of the GaN layer 12 to a plasma generated in a chamber of a plasma generator included in the cleaning apparatus.

The dry cleaning will be explained more specifically. The GaN-based epitaxial substrate 1 having the GaN layer 12 is transferred into the chamber of the plasma generator and an oxygen ($O_2$) gas is introduced into the chamber to generate $O_2$ plasma. Then, it is possible to remove the organic substances stuck on the upper surface 12a of the GaN layer 12, oxygen (O) atoms and hydroxyl (OH) groups spontaneously adhering to the Ga atoms appearing on the upper surface 12a, and the like. Further, a nitrogen ($N_2$) gas may be introduced into the chamber of the plasma generator to generate $N_2$ plasma. The organic substances stuck on the upper surface 12a and the O atoms spontaneously adhering to the Ga atoms may be removed by the $N_2$ plasma.

In the embodiment of the present invention, only one of the $O_2$ plasma and the $N_2$ plasma may be used in cleaning step ST1. Alternatively, in cleaning step ST1, the $O_2$ plasma and the $N_2$ plasma may be sequentially used in the chamber of the plasma generator without exposing to the atmospheric air. Next, in termination step ST2, the upper surface 12a of the GaN layer 12 is irradiated with carbon tetrafluoride ($CF_4$) plasma to terminate the dangling bonds of the Ga atoms appearing on the upper surface 12a of the GaN layer 12 with an F atom. The F-termination using $CF_4$ plasma in termination step ST2 may be executed in the chamber used for surface cleaning in cleaning step ST1, or in another chamber, but it is preferable not to expose the upper surface 12a of the GaN layer 12 to the atmospheric air between the cleaning step and the termination step. Then, it is possible to prevent the organic substances and the like from additionally sticking on the upper surface 12a of the GaN layer 12.

Next, in deposition step ST3, a $SiO_2$ film is deposited on the upper surface 12a of the GaN layer 12. The $SiO_2$ film is the gate insulating film 5 illustrated in FIG. 1. The $SiO_2$ film is deposited by, for example, a chemical vapor deposition (CVD) method using a monosilane ($SiH_4$) gas and an oxygen ($O_2$) gas. The deposition of the $SiO_2$ film in deposition step ST3 may be executed in the chamber used for the F-termination in termination step ST2 or in another chamber, but it is preferable not to expose the upper surface 12a of the GaN layer 12 to the atmospheric air between the termination step and the deposition step. Then, it is possible to prevent the organic substances and the like from additionally sticking to the upper surface 12a of the GaN layer 12.

In deposition step ST3, various vapor deposition methods, such as a plasma CVD method, a reduced pressure CVD method and the like may be used for the CVD method. Raw material gases are not limited to the monosilane ($SiH_4$) gas and oxygen ($O_2$) gas. For example, a TEOS tetraethyl orthosilicate (TEOS) gas and the like may be used for the raw material gas. Further, the $SiO_2$ film may be deposited by an atomic layer deposition (ALD) method instead of the CVD method.

Next, in anneal step ST4, the $SiO_2$ film deposited in deposition step ST3 is annealed. The $SiO_2$ film deposited by vapor phase growth such as CVD tends to have a lower denseness and a lower dielectric strength than thermally-oxidized $SiO_2$ film formed by thermal oxidation. Therefore, in anneal step ST4, annealing of the $SiO_2$ film is executed to increase the denseness of the $SiO_2$ film and to improve the dielectric strength. For example, an annealing temperature may be about 800° C. The annealing is executed in an ambience of an inert gas, such as argon (Ar) and the like, isolated from the atmospheric air.

In termination step ST2, the dangling bonds of the Ga atoms are terminated with the F atoms. As illustrated in Table 1, the Ga—F bond has a larger binding energy and a stronger bond than the Ga—H bond. Therefore, even when the annealing is executed in step ST4, most of the Ga—F bonds are left without desorption of the F atoms from the Ga atoms. The annealing in anneal step ST4 may be executed in the chamber used for the deposition in deposition step ST3 or in another chamber, but it is preferable not to expose the surface of the SiO2 film to the atmospheric air between the deposition step and the annealing step. Then, it is possible to prevent the organic substances and the like from sticking on the surface of the $SiO_2$ film.

Next, in step ST5, a gate electrode film is deposited on the annealed $SiO_2$ film. For the gate electrode film, for example, polysilicon doped with impurities may be used, and the gate electrode film may be deposited by a CVD method and the like. The deposition of the gate electrode film may be executed in the chamber used for the annealing in step ST4, or in another chamber, but it is preferable not to expose the surface of the $SiO_2$ film to the atmospheric air between the annealing process and the gate-electrode-deposition process. Then, it is possible to prevent the organic substances and the like from sticking to the surface of the $SiO_2$ film.

Subsequently, the gate electrode 6 and the insulating film 5 illustrated in FIG. 1 are formed by delineating the gate electrode film and the $SiO_2$ film using a photolithography technique, a dry etching technique and the like. Although illustration is omitted, a photoresist film is coated on the gate electrode 6 and the exposed upper surface 12a of the GaN layer 12, and the coated photoresist film is delineated by a photolithography technique. Using the delineated photoresist film and the gate electrode 6 as a mask for ion-implantation, the n⁺-type source region 14 and the p⁺-type contact region 16 are formed in contact with each other in the upper portion of the GaN layer 12 by implanting n-type dopants and p-type dopants in the upper surface 12*a* of the GaN layer 12, respectively. Thus, the MOS transistor 100 illustrated in FIG. 1 is completed.

The F-termination of the dangling bonds of Ga atoms provides advantages such that the bandgap-states are not generated in the Ga—F bonding interface, and that the Ga—F bond has the strongest bond among the monatomic bond. Further, as mentioned above, since the dangling bonds of the Ga atoms can be terminated only by exposing the surface of the GaN layer 12 to the $CF_4$ plasma, the termination process may be simplified. Advantage of using the $SiO_2$ film for the gate insulating film 5 is that, since the $SiO_2$ film has a large bandgap and a large band-offset with the GaN layer, good insulation can be ensured regardless of the n-type or p-type GaN layer.

<Effectiveness>

As described above, the nitride semiconductor device according to the embodiment of the present invention includes the GaN layer, and the gate insulating film 5 provided on the upper surface 12*a* of the GaN layer 12. The gate insulating film 5 has the O atoms and the other constituent atoms of the gate insulating film 5 other than the O atoms, for example, the Si atoms. The interface 21 in which the GaN layer 12 and the gate insulating film 5 are in contact with each other contains the F atoms terminating the dangling bonds of the Ga atoms. Each F atom has a valence, or outermost, electron shell in which one electron is deficient from an allowed number of valence electrons, and is an atom having stronger bond to the Ga atom than the H atom. In the interface 21 between the GaN layer 12 and the gate insulating film 5, the amount of bonds between the Ga atoms and the O atoms is greater than the amount of bonds between the Ga atoms and the other constituent atoms of the gate insulating film 5 other than the O atoms, for example, the Si atoms.

In such configuration, since the dangling bonds of the Ga atoms are strongly bonded to the F atoms, even when the annealing is applied after the termination of the Ga atoms, desorption of the termination atoms from the Ga atoms may be prevented. Then, the termination of Ga atoms can be maintained well. As a result, since it is possible to prevent carriers from being trapped in the dangling bonds, a decrease in the carrier mobility may be prevented, and high conduction can be available. Thus, deterioration of electrical characteristics due to the dangling bonds can be suppressed.

The interface between the GaN layer 12 and the gate insulating film 5 may mainly have the Ga—O bonds, which are bonds between the Ga atoms and the O atoms. Thereby, in the interface, the interface state near the upper end of the valence band can be reduced, and the generation of the bandgap-states can be prevented. Thus, the carriers are prevented from being trapped in the bandgap-states, so that the deterioration of the electrical characteristics can be further suppressed.

<Modification>

As mentioned above, it has been described that the dangling bonds of the Ga atoms are terminated with the F atoms. However, in the embodiment of the present invention, the terminating species terminating the dangling bonds of the Ga atoms is not limited to the F atom. The terminating species terminating the dangling bonds of the Ga atom may include other than the F atom, for example, any one or more of a chlorine (Cl) atom, a hydroxyl (OH) group, and a cyano (CN) group.

(First Modification)

Figure 7:
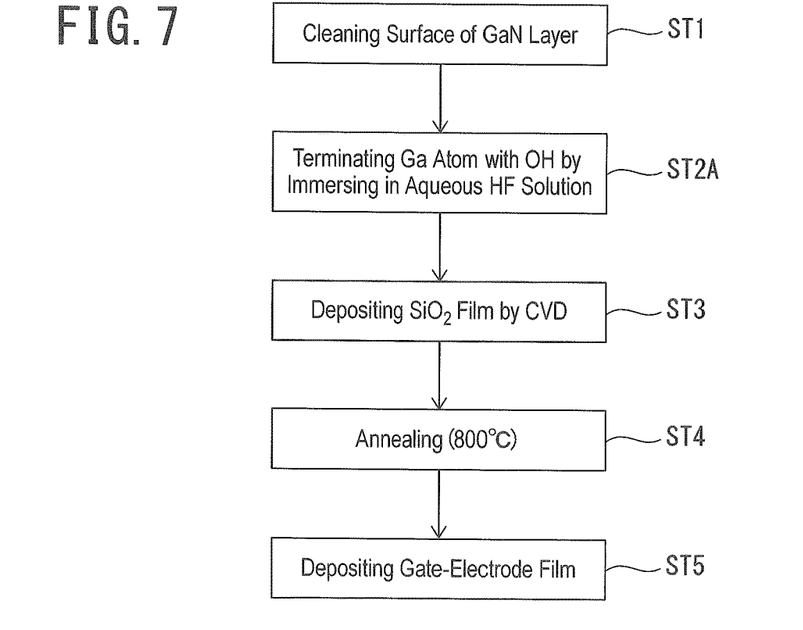
FIG. 7 is a flowchart illustrating an example of a process for forming a planar insulated-gate structure, which includes a termination step of a dangling bond of the Ga atom with an OH group, in a manufacturing method of the MOS transistor according to a first modification of the embodiment of the present invention.

FIG. 7 is a flowchart illustrating a process for forming a planar insulated-gate structure in a manufacturing method of the MOS transistor 100 according to a first modification of the embodiment of the present invention, which includes a step of terminating the dangling bonds of the Ga atoms with OH groups. As illustrated in FIG. 7, the first modification is different from the embodiment in that a termination step is executed in step ST2A, instead of step ST2 illustrated in FIG. 5 in the embodiment of the present invention. Since the other steps are the same as those of the steps of the present embodiment, redundant description will be omitted.

In step ST2A, the GaN-based semiconductor substrate 1 having the GaN layer 12 is immersed in an aqueous solution of hydrofluoric acid (HF) in the cleaning apparatus, and the dangling bonds of the Ga atoms appearing on the upper surface 12*a* of the GaN layer 12 are terminated with OH groups. As illustrated in Table 1, Ga—OH bonds between the Ga atoms and OH groups have the larger binding energy than the Ga—H bonds between the Ga atoms and the H atoms, and the Ga—OH bonds are stronger than the Ga—H bonds. Therefore, even when the annealing is executed in step ST4, most of the Ga—OH bonds are left without desorption of the OH groups from the Ga atoms.

The OH-termination of the dangling bonds of Ga atoms provides advantages such that the bandgap-states are not generated in the Ga—OH bonding interface, and that the Ga—OH bonds are stronger than the Ga—H bonds, as illustrated in Table 1. Further, as mentioned above, since the dangling bonds of the Ga atoms may be terminated only by immersing the GaN-based semiconductor substrate 1 in the HF aqueous solution, the termination process may be simplified.

(Second Modification)

Figure 8:
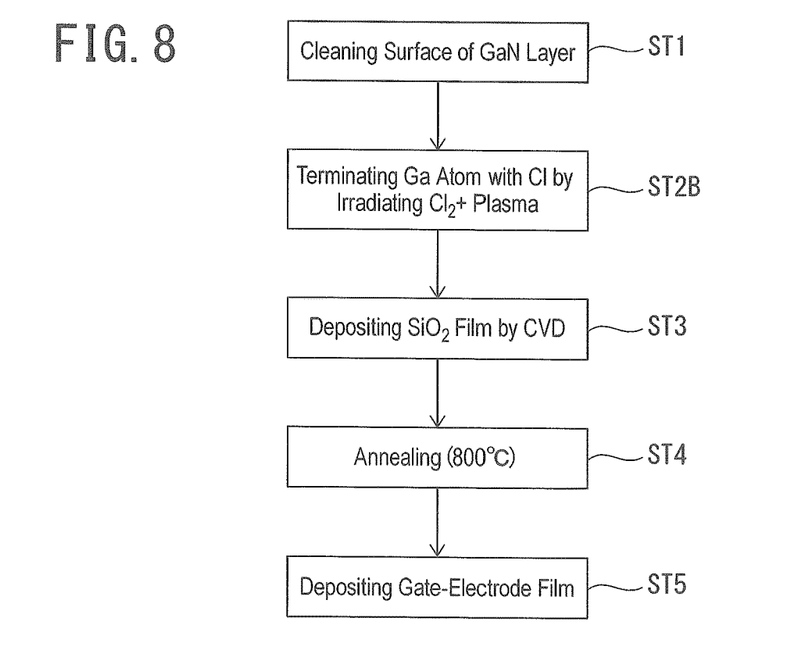
FIG. 8 is a flowchart illustrating an example of a process for forming a planar insulated-gate structure, which includes a termination step of a dangling bond of the Ga atom with a Cl atom, in a manufacturing method of the MOS transistor according to a second modification of the embodiment of the present invention.

FIG. 8 is a flowchart illustrating a process for forming a planar insulated-gate structure in a manufacturing method of the MOS transistor 100 according to a second modification of the embodiment of the present invention, which includes a step of terminating the dangling bonds of the Ga atoms with Cl atoms. As illustrated in FIG. 8, the second modification is different from the embodiment and the first modification in that a termination step is executed in step ST2B, instead of step ST2 illustrated in FIG. 5, or step ST2A illustrated in FIG. 7. Since the other steps are the same as those of the steps of the embodiment and the first modification, redundant description will be omitted.

In step ST2B, the upper surface 12*a* of the GaN layer 12 is irradiated with chlorine ($Cl_2^+$) plasma to terminate the dangling bonds of the Ga atoms appearing on the upper surface 12*a* of the GaN layer 12 with Cl atoms. As illustrated in Table 1, the Ga—Cl bonds between the Ga atoms and the Cl atoms have a larger binding energy than the Ga—H bonds between the Ga atoms and the H atoms, and the Ga—Cl bonds are stronger than the Ga—H bonds. Therefore, even when the annealing is executed in step ST4, most of the Ga—Cl bonds are left without desorption of the Cl atoms from the Ga atoms.

The Cl-termination of the dangling bonds of Ga atoms provides advantages such that the bandgap-states are not generated in the Ga—Cl bonding interface, and that the Ga—Cl bonds are stronger than the Ga—H bonds, as illustrated in Table 1. Further, as mentioned above, since the dangling bonds of the Ga atoms may be terminated only by exposing the surface of the GaN layer 12 to the $Cl_2^+$ plasma, the termination process may be simplified.

(Third Modification)

Figure 9:
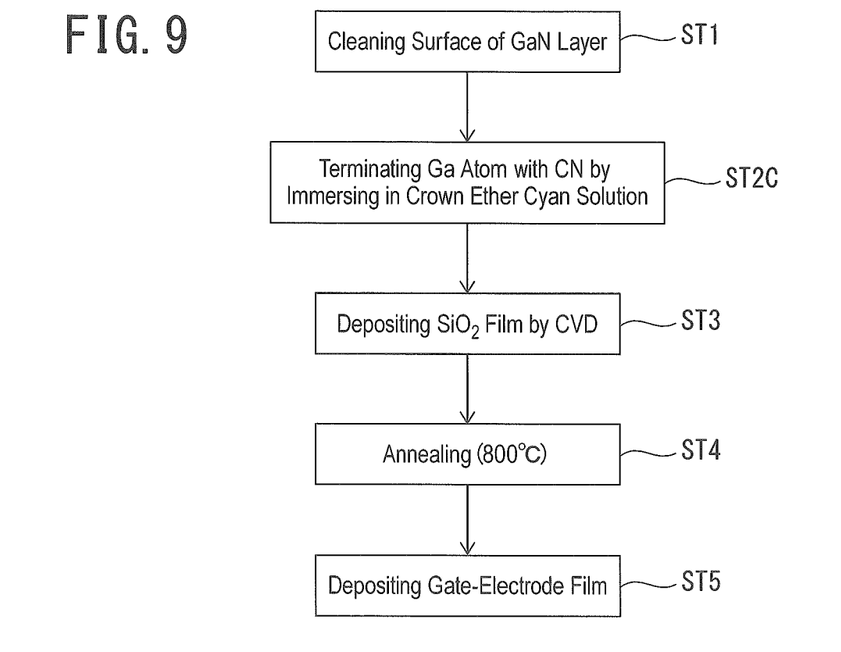
FIG. 9 is a flowchart illustrating an example of a process for forming a planar insulated-gate structure, which includes a termination step of a dangling bond of the Ga atom with a CN group, in a manufacturing method of the MOS transistor according to a third modification of the embodiment of the present invention.

FIG. 9 is a flowchart illustrating a process for forming a planar insulated-gate structure in a manufacturing method of the MOS transistor 100 according to a third modification of the embodiment of the present invention, which includes a step of terminating the dangling bonds of the Ga atoms with CN groups. As illustrated in FIG. 9, the third modification is different from the embodiment, the first and second modifications in that a termination step is executed in step ST2C, instead of step ST2 illustrated in FIG. 5, step ST2A illustrated in FIG. 7, or step ST2B illustrated in FIG. 8. Since the other steps are the same as those of the steps of the embodiment, the first and second modifications, redundant description will be omitted.

In step ST2C, the GaN-based semiconductor substrate 1 having the GaN layer 12 is immersed in a crown ether cyan solution in the cleaning apparatus, and the dangling bonds of the Ga atoms appearing on the upper surface 12a of the GaN layer 12 are terminated with CN groups. As illustrated in Table 1, the Ga—CN bonds between the Ga atoms and the CN groups have the larger binding energy than the Ga—H bonds between the Ga atoms and the H atoms, and the Ga—CN bonds are stronger than the Ga—H bonds. Therefore, even when the annealing is executed in step ST4, most of the Ga—CN bonds are left without desorption of the CN groups from the Ga atoms.

The CN-termination of the dangling bonds of Ga atoms provides advantages such that the bandgap-states are not generated in the Ga—CN bonding interface, and that the Ga—CN bonds are stronger than the Ga—H bonds, as illustrated in Table 1. Further, as mentioned above, since the dangling bonds of the Ga atoms may be terminated only by immersing the GaN-based semiconductor substrate 1 in the crown ether cyan solution, the termination process may be simplified.

Other Embodiments

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

For example, the p-type dopant used in the MOS transistor 100 is not limited to magnesium (Mg). For the p-type dopant beryllium (Be), zinc (Zn) and cadmium (Cd) may be used. Further, the channel region CR may contain any one or more of Mg, Be, Zn, and Cd as the p-type dopant at a concentration of about $1\times10^{16}$ per cubic-centimeter or more Further, the gate insulating film 5 is not limited to the SiO2 film. For the gate insulating film 5, for example, an aluminum oxide ($Al_2O_3$) film may be used. The gate insulating film 5 may be an oxide film or an oxynitride film, which includes at least one of boron (B), aluminum (Al), silicon (Si), gallium (Ga), scandium (Sc), tantalum (Ti), yttrium (Y), zirconium (Zr), hafnium (Hf), tantalum (Ta), and tungsten (W).

Further, in FIG. 1, an n-type junction FET (JFET) region may be provided in the drift region immediately below the gate insulating film 5. The JFET region is a region in which concentration of the n-type dopants is higher and electrical resistance is lower than the other drift region. By providing the JFET region, on-resistance of the MOS transistor 100 may be reduced.

Further, in the embodiment and the first to third modifications of the present invention, the GaN layer 12 is exemplified as the "GaN-based semiconductor layer", but the "GaN-based semiconductor layer" is not limited to the GaN layer. For example, the "GaN-based semiconductor layer" may be a bulk GaN substrate. Further, the "GaN-based semiconductor layer" may contain a GaN semiconductor as a main component, and may further contain any one or more of an aluminum nitride (AlN) semiconductor and an indium nitride (InN) semiconductor.

It should be noted that the present invention includes various embodiments which are not disclosed herein. Therefore, the scope of the present invention is defined only by the present invention specifying matters according to the claims reasonably derived from the description heretofore.

What is claimed is:

1. A nitride semiconductor device comprising:
a gallium nitride-based semiconductor layer; and
an insulating film provided on a first surface of the gallium nitride-based semiconductor layer, the insulating film containing oxygen atoms, and other constituent atoms other than oxygen, wherein
an interface between the gallium nitride-based semiconductor layer and the insulating film has a terminating species which terminates a dangling bond of a gallium (Ga) atom,
the terminating species has an outermost (valence) electron shell in which one electron is deficient from an allowed number of outermost electrons, and is an atom or molecule having stronger bond to the gallium atom than a hydrogen atom,
an amount of bonds between the gallium atoms and the oxygen atoms is greater than an amount of bonds between the Ga atoms and the other constituent atoms, and wherein,
when a first range is defined as a range within 10 nanometers from the interface toward the gallium nitride-based semiconductor layer and a second range is defined as a range within 10 nanometers from the interface toward the gate insulating film, at least one of the first range and the second range has a region in which the terminating species are provided at about $1\times10^{11}$ per square-centimeter or more.

2. The nitride semiconductor device of claim 1, wherein the terminating species includes at least one of fluorine, chlorine, a hydroxyl group, and a cyano group.

3. The nitride semiconductor device of claim 1, wherein the gallium nitride-based semiconductor layer has a conductive region located within 20 nanometers from the first surface in contact with the insulating film to a second surface located on an opposite side of the first surface, and a concentration of p-type dopants in the conductive region is higher than that of n-type dopants in the conductive region.

4. The nitride semiconductor device of claim 3, wherein the conductive region contains at least one of magnesium, beryllium, zinc, and cadmium at a concentration of $1\times10^{16}$ per cubic-centimeter or more.

5. The nitride semiconductor device of claim 1, wherein a crystal plane of the first surface is (0001) plane, (1-100) plane, (11-20) plane or (1-102) plane.

6. The nitride semiconductor device of claim 1, wherein the amount of bonds between the gallium atoms and the oxygen atoms in the interface is 10 times or more the amount of bonds between the gallium atoms and the other constituent atoms.

7. The nitride semiconductor device of claim 1, wherein the insulating film is an oxide film or an oxynitride film having at least one atom of boron, aluminum, silicon, gallium, scandium, titanium, yttrium, zirconium, hafnium, tantalum, and tungsten.

8. A nitride semiconductor device comprising:
a gallium nitride-based semiconductor layer; and
an insulating film provided on a first surface of the gallium nitride-based semiconductor layer, the insulating film containing oxygen atoms, and other constituent atoms other than oxygen, wherein
an interface between the gallium nitride-based semiconductor layer and the insulating film has a terminating species which terminates a dangling bond of a gallium (Ga) atom,
the terminating species has an outermost (valence) electron shell in which one electron is deficient from an allowed number of outermost electrons, and is an atom or molecule having stronger bond to the gallium atom than a hydrogen atom,
an amount of bonds between the gallium atoms and the oxygen atoms is greater than an amount of bonds between the Ga atoms and the other constituent atoms, and
the gallium nitride-based semiconductor layer has a conductive region located within 20 nanometers from the first surface in contact with the insulating film to a second surface located on an opposite side of the first surface, and a concentration of p-type dopants in the conductive region is higher than that of n-type dopants in the conductive region.

9. The nitride semiconductor device of claim 8, wherein the conductive region contains at least one of magnesium, beryllium, zinc, and cadmium at a concentration of $1\times10^{16}$ per cubic-centimeter or more.

* * * * *

UNITED STATES PATENT AND TRADEMARK OFFICE
CERTIFICATE OF CORRECTION

PATENT NO. : 11,830,915 B2
APPLICATION NO. : 17/186274
DATED : November 28, 2023
INVENTOR(S) : Yuki Ohuchi et al.

It is certified that error appears in the above-identified patent and that said Letters Patent is hereby corrected as shown below:

In the Specification

Column 1, Line 6, delete "P2020-045613" and insert --JP2020-045613--.

Signed and Sealed this
Twenty-third Day of January, 2024

Katherine Kelly Vidal
*Director of the United States Patent and Trademark Office*